(12) United States Patent
Deighton et al.

(10) Patent No.: US 11,665,874 B2
(45) Date of Patent: *May 30, 2023

(54) MISSION CONFIGURABLE SHELTER

(71) Applicant: HDT EXPEDITIONARY SYSTEMS, INC., Solon, OH (US)

(72) Inventors: Charles Deighton, Milford, OH (US); Wade Milek, Mason, OH (US)

(73) Assignee: HDT EXPEDITIONARY SYSTEMS, INC., Solon, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/459,051

(22) Filed: Aug. 27, 2021

(65) Prior Publication Data

US 2021/0392799 A1    Dec. 16, 2021

Related U.S. Application Data

(63) Continuation of application No. 16/739,990, filed on Jan. 10, 2020, now Pat. No. 11,109,519.

(60) Provisional application No. 62/792,731, filed on Jan. 15, 2019.

(51) Int. Cl.
| | |
|---|---|
| *E04B 1/346* | (2006.01) |
| *H05K 9/00* | (2006.01) |
| *E04B 1/343* | (2006.01) |
| *E04B 2/00* | (2006.01) |
| *E04H 9/10* | (2006.01) |

(52) U.S. Cl.
CPC ....... *H05K 9/0088* (2013.01); *E04B 1/34321* (2013.01); *E04C 2/46* (2013.01); *E04H 9/10* (2013.01); *H05K 9/0084* (2013.01)

(58) Field of Classification Search
CPC ... B65D 88/121; E04B 1/343; E04B 1/34321; E04C 2/46; E04H 9/10; E04H 2001/1283; H05K 9/0084; H05K 9/0088
USPC .................................. 52/79.1, 270; 220/1.5
See application file for complete search history.

(56) References Cited

U.S. PATENT DOCUMENTS

| | | | | |
|---|---|---|---|---|
| 3,868,297 | A * | 2/1975 | Jamison | B32B 3/12 |
| | | | | 428/626 |
| 3,994,105 | A * | 11/1976 | Jamison | B32B 15/043 |
| | | | | D25/16 |
| 4,726,158 | A * | 2/1988 | Fagnoni | E04B 1/34357 |
| | | | | 52/79.5 |

(Continued)

OTHER PUBLICATIONS

ASTM International, Designation E1 925-04, "Specification For Engineering and Design Criteria for Rigid Wall Relocatable Structures", 2004, pp. 1-12.

(Continued)

*Primary Examiner* — Brian E Glessner
*Assistant Examiner* — James J Buckle, Jr.
(74) *Attorney, Agent, or Firm* — Lippes Mathias LLP

(57) ABSTRACT

A lightweight transportable containerized shelter includes wall panels made of a non-metal composite material coated at least on its inner face with a metal layer for EMI protection. The several wall panels are secured to a metal structural frame without the use of fasteners so as to define a containerized transportable shelter. The shelter meets ISO standards 668 and 1496. The shelter provides a continuous barrier to electromagnetic signals. Moreover, the containerized shelter is amenable to nine high stacking as required for ISO certification.

20 Claims, 13 Drawing Sheets

(56) References Cited

U.S. PATENT DOCUMENTS

| | | | | |
|---|---|---|---|---|
| 5,170,901 | A | * | 12/1992 | Bersani ................. E04B 1/3431 296/26.14 |
| 5,237,784 | A | * | 8/1993 | Ros ....................... B60P 1/6427 52/79.5 |
| 5,285,604 | A | | 2/1994 | Carlin |
| 5,732,839 | A | * | 3/1998 | Schimmang ........ E04B 1/34305 220/4.03 |
| 5,761,854 | A | * | 6/1998 | Johnson ................... B60P 3/34 52/79.5 |
| 6,085,469 | A | | 7/2000 | Wolfe |
| 7,243,464 | B1 | | 7/2007 | Crowell |
| 7,334,697 | B2 | | 2/2008 | Myers et al. |
| 7,418,802 | B2 | * | 9/2008 | Sarine ................. E04B 1/34305 52/79.5 |
| 7,823,337 | B2 | * | 11/2010 | Pope ..................... E04B 1/3431 52/79.5 |
| 7,827,738 | B2 | | 11/2010 | Abrams |
| 7,874,107 | B1 | | 1/2011 | Medley et al. |
| 8,166,715 | B2 | * | 5/2012 | De Azambuja ........... B60P 3/34 52/79.5 |
| 8,770,422 | B2 | * | 7/2014 | Cantin ..................... E04H 15/34 206/595 |
| 9,221,599 | B2 | * | 12/2015 | Brennan, Jr. .......... B65D 90/08 |
| 9,702,160 | B2 | | 7/2017 | Wirtz |
| 2002/0148626 | A1 | * | 10/2002 | Matsumura .......... H05K 9/0088 174/371 |
| 2007/0144078 | A1 | * | 6/2007 | Frondelius .......... E04B 1/34305 52/67 |
| 2007/0170740 | A1 | * | 7/2007 | Di Franco ................ B60P 3/34 296/26.13 |
| 2008/0134589 | A1 | * | 6/2008 | Abrams .............. E04B 1/34807 52/79.1 |
| 2008/0256878 | A1 | * | 10/2008 | Berns ..................... E04B 1/3444 52/741.1 |
| 2009/0217600 | A1 | | 9/2009 | De Azambuja |
| 2011/0132421 | A1 | * | 6/2011 | Dolsby ................. E04H 15/008 135/143 |
| 2015/0030878 | A1 | * | 1/2015 | Zhi ....................... H05K 9/0088 428/323 |
| 2016/0265227 | A1 | | 9/2016 | Clouse et al. |
| 2017/0051503 | A1 | | 2/2017 | Kalinowski |
| 2017/0354064 | A1 | | 12/2017 | Milek et al. |
| 2019/0104651 | A1 | * | 4/2019 | Garagnani ........... H05K 9/0001 |
| 2021/0180317 | A1 | * | 6/2021 | Shields ................ E04B 1/7629 |

OTHER PUBLICATIONS hdtglobal.com, "Mission-Ready, Rigid Wall Shelters For Mobile or Semi-Permanent Operations" (2017) 2 pages.

hdtglobal.Com, "Flat-Pack Rigid Wall Shelters Military-Grade, Fully Integrated, Any Size, Relocatable Shelters" (2017) 2 pages.

http://www.hdtglobal.com/product/emi-shelter/, "EMI Shelter", Sep. 23, 2018, 2 pages.

http://www.gichner.us/fscs.html, "Fixed Site Composite Shelter", Sep. 25, 2019, 1 page.

https://www.aarcorp.com/20-foot-non-expandable-iso-shelter/, "20-Foot Non-Expandable ISO Shelter", Oct. 2, 2019, 3 pages.

https://gdmissionsystems.com/en/services/shelter-systems, "General Dynamics Mission Systems, Shelters", Oct. 2, 2019, 3 pages.

https://www.sbir.gov/print/sbirsearch/detail/333512, "Low Cost Electro Magnetic Interference (EMI) Composite Shelter", Sep. 24, 2019, 2 pages.

https://www.standard.no/en/webshop/productcatalog/productpresent . . . , ASTM E1925:10, "Specification for Engineering and Design Criteria for Rigid Wall Relocatable Structures", Sep. 24, 2019, 1 page.

https://www.sbir.gov/print/sbirsearch/detail/1254591, "Electro-Magnetic Interference Composite Rigid Wall Shelter", Sep. 24, 2019, 4 pages.

http://www.seabox.com/products/category/containerized-shelters, "Containerized Shelters", Aug. 21, 2018, 1 page.

www.dupontbuilding.com, Dupont Building Inc. Flyer, "Fiberglass Shelters", Jan. 2020, 2 pages.

\* cited by examiner

MISSION CONFIGURABLE SHELTER

CROSS-REFERENCE TO RELATED APPLICATIONS

This application is a continuation of U.S. application Ser. No. 16/739,990 filed Jan. 10, 2020 (Jan. 10, 2020), now assigned U.S. Pat. No. 11,109,519, which claims priority from and benefit of the filing date of U.S. provisional application Ser. No. 62/792,731 filed Jan. 15, 2019 (Jan. 15, 2019), and the entire disclosure of each of said prior applications is hereby expressly incorporated by reference into the present specification.

BACKGROUND

The present disclosure relates generally to transportable shelters and more particularly to shelters which satisfy military standards with regard to electromagnetic emissions (EMI) protection. In addition, such shelters need to satisfy International Standards Organization (ISO) requirements with regard to robust transportable structures that are also stackable.

In the modern era, the use of sensitive electronic systems has become very important for industrial, commercial and military applications. Electronic systems give off electromagnetic signals and electrical equipment is susceptible to such emissions. This is termed electromagnetic interference (EMI), sometimes also known as radio-frequency interference (RFI) when in the radio frequency spectrum. Thus, EMI is a growing risk and an issue when numerous electronic systems are in close proximity to each other, as their emissions can interfere with each other, causing damage to the systems or improper operation of the systems. Furthermore, EMI is produced by electrical systems like power transmission lines and even cell towers. Because of the widespread use of power lines and various other EMI emitting devices, EMI is a growing problem for electronic equipment.

Cyber security of electronic equipment is also a growing problem due to bad actors intercepting electromagnetic signals from such equipment as a means to obtain information that was intended to be secure and, thus, steal the information or spy on the transmission of such information. In addition, bad actors can generate EMI with the intent to destroy or damage important electronic equipment. Thus, a shelter or container which provides proper EMI protection would be very useful for both industrial and military applications.

EMI attenuation and protection is provided in some shelters and containers today. Such protection is conventionally provided by the use of continuous metal walls or skins for the shelter. If the goal is to significantly reduce or eliminate any transmitted EMI, metallic materials which are conductive, such as steel, copper and some types of aluminum are ideal because they reflect as well as absorb EMI. The absorbed EMI is then carried away by electrical grounding. Because modern electronics operates and higher and higher frequencies, even small gaps, holes or seams in the known metal structures will be a route for the transmission of EMI waves. In other words, a shelter which provides adequate EMI protection at 10 MHz frequencies may not necessarily provide adequate protection at 10 GHz frequencies. Thus, for acceptable EMI attenuation, the shelter should provide a continuous shell of protection, even at high frequencies. In other words, EMI protection has to be continuous in 360°, i.e., from floor to wall to ceiling, around the containerized shelter.

Containers suitable for transportation by truck, ship or air must generally comply with the standards and regulations set forth by the International Standards Organization (ISO), namely ISO 668 and 1496, as well as ASTM E1925-04. Furthermore, containers that are to be transported by helicopter, such as sometimes occurs for military or other purposes, must be able to support the dynamic load imposed on them by the lifting of the containers. Therefore, such containers generally include a metal framework and metal panels attached to the framework by bolts, rivets, welding or the like. It can be appreciated that such containers are inherently heavy.

Current shelters or containers are generally fabricated using thick metal materials in order to obtain the proper balance of structural strength and EMI protection. In order to obtain adequate EMI protection, particularly at seams and corners, difficult processes like seam welding are necessary in order to join all the components together and produce the necessary continuous shell of EMI protection. Moreover, the welding process requires that the metal of the several wall sections be fairly thick in order to properly weld. Unfortunately, this adds cost and undesired weight to the container. In addition, if the walls of the container are made of metal, then additional labor is required in order to apply thermal insulation to the container so as to complete a suitable wall, ceiling or floor section for a shelter which is useable in varying weather conditions. Further, external coating of the metal of such a shelter is also necessary, as metal corrodes if it is not treated or painted.

As mentioned, to secure metal panels to a metal frame, welding or a large number of rivets is necessary. Obviously, this is very labor intensive. Moreover, metals have become more and more expensive through the years. Therefore, it would be desirable to provide EMI protection for a transportable shelter at a relatively lower cost. It would further be desirable to provide shelters which can be more easily assembled.

The maximum or gross weight of a filled ISO container is generally fixed. For example, for a twenty foot container, the maximum gross weight is 60,000 pounds. It should be appreciated that for each pound of weight saved in the weight of the container, another pound of cargo can be shipped. A standard steel twenty foot cargo container weighs about 5,000 pounds. Therefore, only 55,000 pounds of cargo can be shipped. On the other hand, if the container weight could be reduced to, for example, 3,000 pounds, then the container could ship up to 57,000 pounds of cargo. It would be desirable to develop a relatively lighter weight container which can still meet ISO specifications in order to increase the amount of cargo which could be shipped in the container.

More recently, in an effort to develop lighter containers, some transportable containers which are meant to meet ISO size requirements have been formed of composite material panels that are fastened to a metal frame. However, the roof, sides and floor panels of such lighter containers typically do not support any structural loads or provide any structural resistance to externally applied forces. Therefore, the metal framework for these containers must have sufficient mass and structural strength to support both the cargo load and accommodate any externally applied forces. In order to secure such composite panels to the metal framework, fasteners, clips or other fastening means must be used. It would be advantageous to secure the composite wall panels to the metal framework by adhesive instead of fasteners in order to simplify and speed up the process of manufacturing a shelter. It would also be advantageous to provide composite material panels which can support structural loads and can provide structural resistance to external forces.

As mentioned, the International Standards Organization (ISO) has established the requirements for containers. One of these requirements calls for the stackability of the containers. More particularly, ISO standards call for containers that are strong enough to allow for a nine high stacking, i.e., the container at the bottom of the stack has to hold the maximum weight of eight containers positioned on top of it. Achieving this necessary structural strength requires a critically engineered structure and a lot of metal is required in the design of the container in order to support eight containers atop the bottom one. It would be desirable to achieve the strength to meet the requirements of nine high stacking, while using relatively lighter weight materials.

In most container-type shelter constructions, different extruded frame members are necessary in order to allow the various wall elements to be secured to the frame, particularly at the corners of the shelter. It would be advantageous to provide identical extrusions for all of the elongated frame members which are employed to form the container in order to simplify the process of assembling such containers meant for use as shelters.

It would further be advantageous to provide a robust transportable containerized shelter structure that is EMI protected with integrated electrical and mechanical equipment which is installed at the factory so that the various systems can be tested at the factory and, thus, are ready to use the moment the shelter is delivered to its operational site. In other words, it would be advantageous to provide a prepackaged containerized EMI protected shelter system which is ready to use at a desired location.

BRIEF SUMMARY

The present disclosure pertains to a lightweight transportable container in which wall panels are made of non-metallic composite materials coated on their inner faces with a metal layer and which also employs a metal gasket at the joints of the wall panels to provide 360° EMI protection. The container provides a continuous barrier to electromagnetic signals such that a ferritic cage is defined inside the container. The several wall panels are secured to a metal structural frame without the use of fasteners so as to define an easily assembled transportable shelter. The container meets ISO standards and can be ISO certified.

In accordance with one aspect of the present disclosure, a containerized shelter structure includes a plurality of identical metallic frame members with each member being formed to accommodate at least two wall panels of the structure. The structure can also be provided with a door. As shipped from the factory, the containerized shelter structure can be provided with the necessary electrical and mechanical equipment so that the shelter is ready for use as soon as the shelter is delivered to the site.

In accordance with another embodiment of the present disclosure, a shelter which provides electromagnetic interference (EMI) protection comprises a plurality of interconnectable frame members which cooperate to together define a three-dimensional structure, wherein each frame member is elongated along a longitudinal axis and includes walls defining a first U-shaped channel, a first groove open to the first channel, and, spaced therefrom, a second groove open to a first channel. A plurality of composite wall panels are provided, each panel including first and second side edges and first and second end edges. Each panel includes a first face. A metal foil layer is mounted to the first face of each panel of the plurality of panels. An adhesive is located in the first groove of each frame member for securing an edge of a respective panel to a respective frame member. The first and second side edges and first and second end edges of a wall panel are held in the first channel of a respective frame member by the adhesive. An EMI mesh gasket is located in the second groove of each frame member.

In accordance with still another embodiment of the present disclosure, a containerized shelter which provides electromagnetic interference (EMI) protection comprises a plurality of interconnectable metal frame members, wherein each frame member comprises elongated walls defining a first U-shaped channel, a first groove open to the first channel and, spaced therefrom, a second groove open to the first channel, and also a second U-shaped channel which is oriented transverse to the first channel, a third groove open to the second channel and, spaced therefrom, a fourth groove open to the second channel. A plurality of metal corner members are provided via which the plurality of frame members are connected together to define a three-dimensional structure. A plurality of non-metallic wall panels are provided, each panel including first and second side edges and first and second end edges and each panel includes a first face. A metal foil layer is mounted to the first face of each of the plurality of panels. An adhesive bead is located in the first and third grooves of each frame member. An EMI mesh gasket is located in the second and fourth grooves of each frame member. The first and second side edges and first and second end edges of a respective wall panel are adhesively held in the first and second channels of the respective frame members.

In accordance with yet another embodiment of the present disclosure, an ISO shipping container which functions as an electromagnetic interference (EMI) shelter comprises a plurality of interconnectable metallic frame members which each include elongated walls which serve to define a first U-shaped channel, a first groove open to the first channel and, spaced therefrom, a second groove open to the first channel, and also a second U-shaped channel which is oriented transverse to the first channel, a third groove open to the second channel and a fourth groove, spaced from the third groove, which is open to the second channel. A plurality of non-metallic composite panels forming the walls, floor and roof of the shelter are provided, each including a first face. A metal foil layer is mounted to the first face of each panel of the plurality of panels. An adhesive bead is located in the first and third grooves. An EMI mesh gasket is located in the second and fourth grooves. Respective edges of each of the plurality of panels are adhesively held in respective grooves of the respective frame members to form a three-dimensional structure. A ferritic cage is defined in the shelter by the cooperation of the metal foil layers with EMI mesh gaskets and the metal frame members. The shipping container is capable of satisfying shipping industry standard requirements for stackability.

BRIEF DESCRIPTION OF THE DRAWINGS

The present disclosure may take physical form in certain parts and arrangements of parts, several embodiments of which will be described in detail in this specification and illustrated in the accompanying drawings which form a part hereof and wherein.

DETAILED DESCRIPTION

Figure 1:
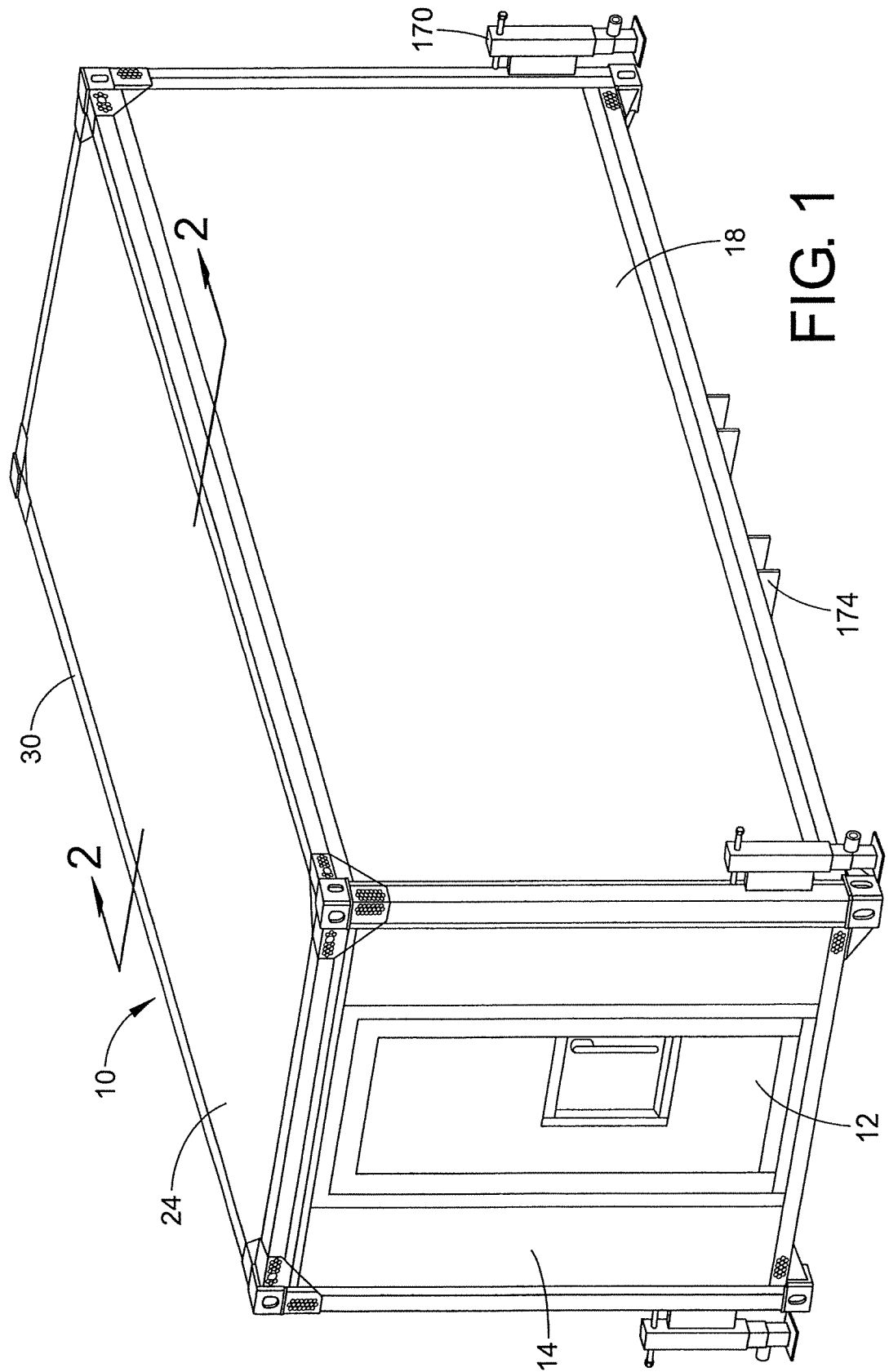
FIG. 1 is a perspective view of a containerized shelter structure according to one embodiment of the present disclosure.
Figure 2:
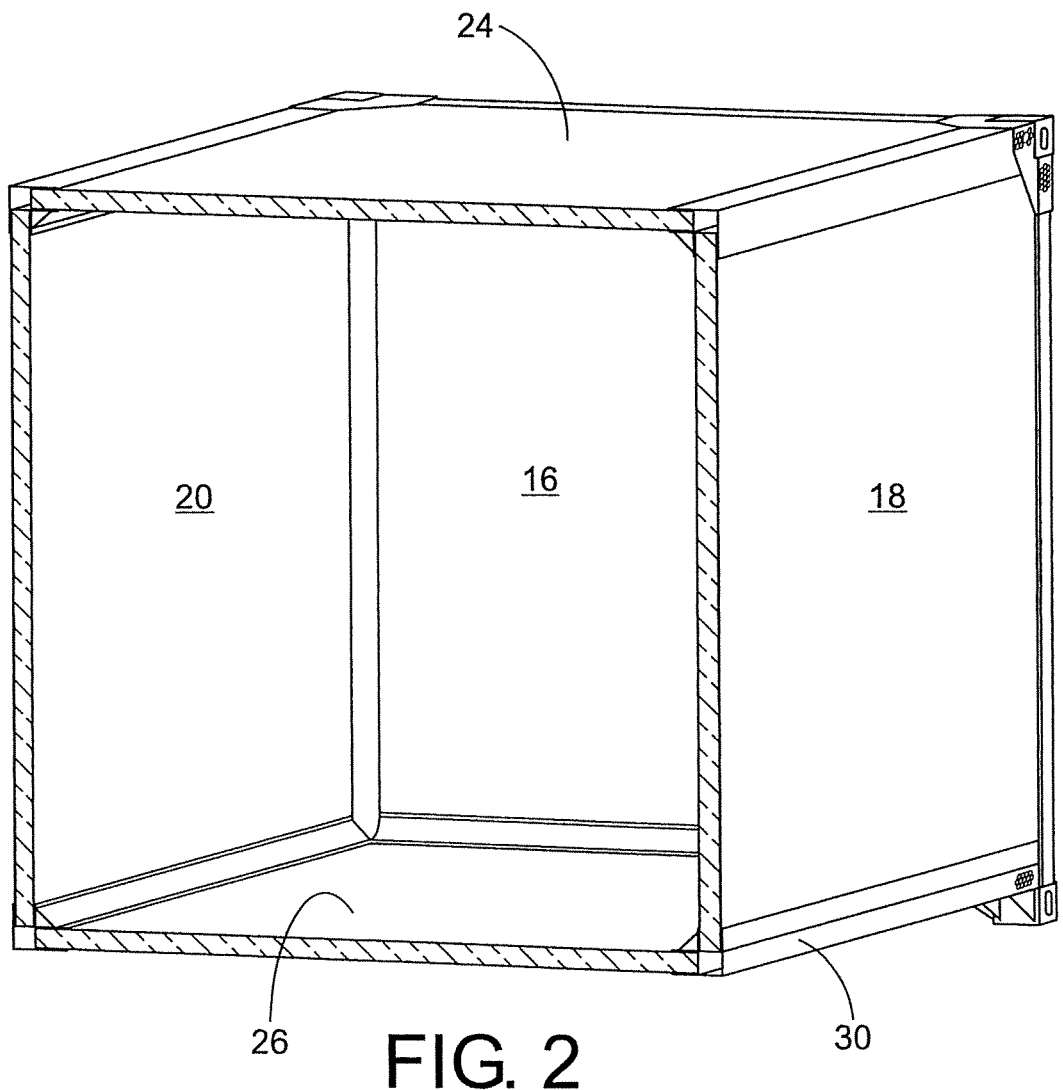
FIG. 2 is a cross sectional view of the containerized shelter of FIG. 1 along line 2-2.

With reference to FIG. 1, illustrated there is a perspective view of a containerized shelter 10 according to a first embodiment of the present disclosure. The shelter 10 includes a door 12 located on a first end wall 14 of the shelter. For example, in one embodiment, the door can be made of a heavy-duty aluminum alloy and can be mounted on the outside of the first end wall 14. In one embodiment, the door can be 7 ft. high and 3 ft. wide and can be weather stripped and EMI protected. The door can be locked with suitable conventional locks and provided with non-rusting hinges. A second end wall 16 (see FIG. 2) may be a solid wall if so desired. Of course, a second door could be mounted to the second end wall if so desired. The shelter also includes first and second side walls 18 and 20, as well as a top wall 24 and a bottom wall 26. If desired, the shelter could also include one or more windows disposed on one of the side walls. EMI protection for the window areas can be achieved by, for example, employing a ballistic glass, i.e., an acrylic material which absorbs electronic waves.

Figure 4:
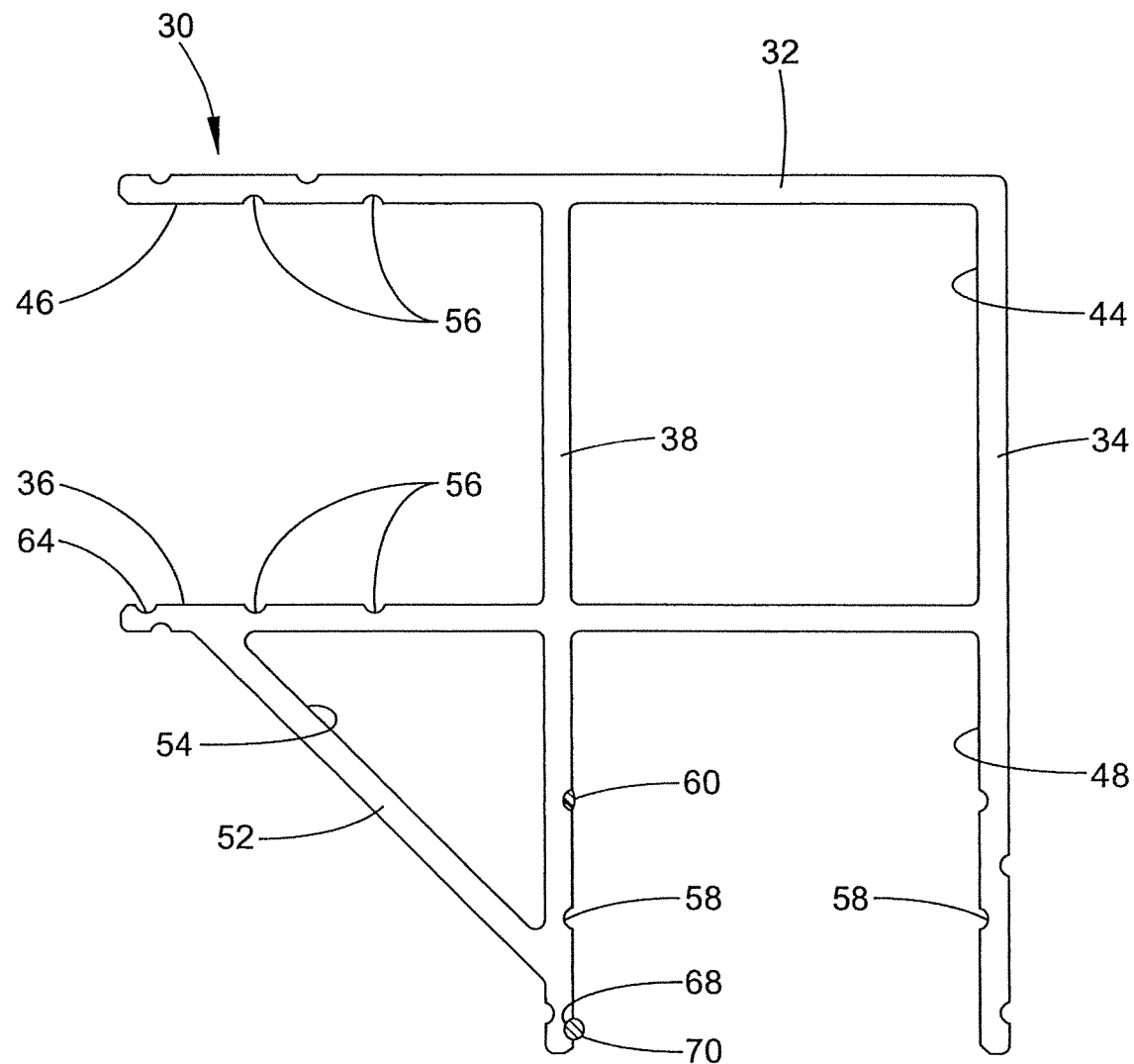
FIG. 4 is a greatly enlarged cross-sectional view of a cut away portion of a frame member of the containerized shelter of FIG. 1.
Figure 5:
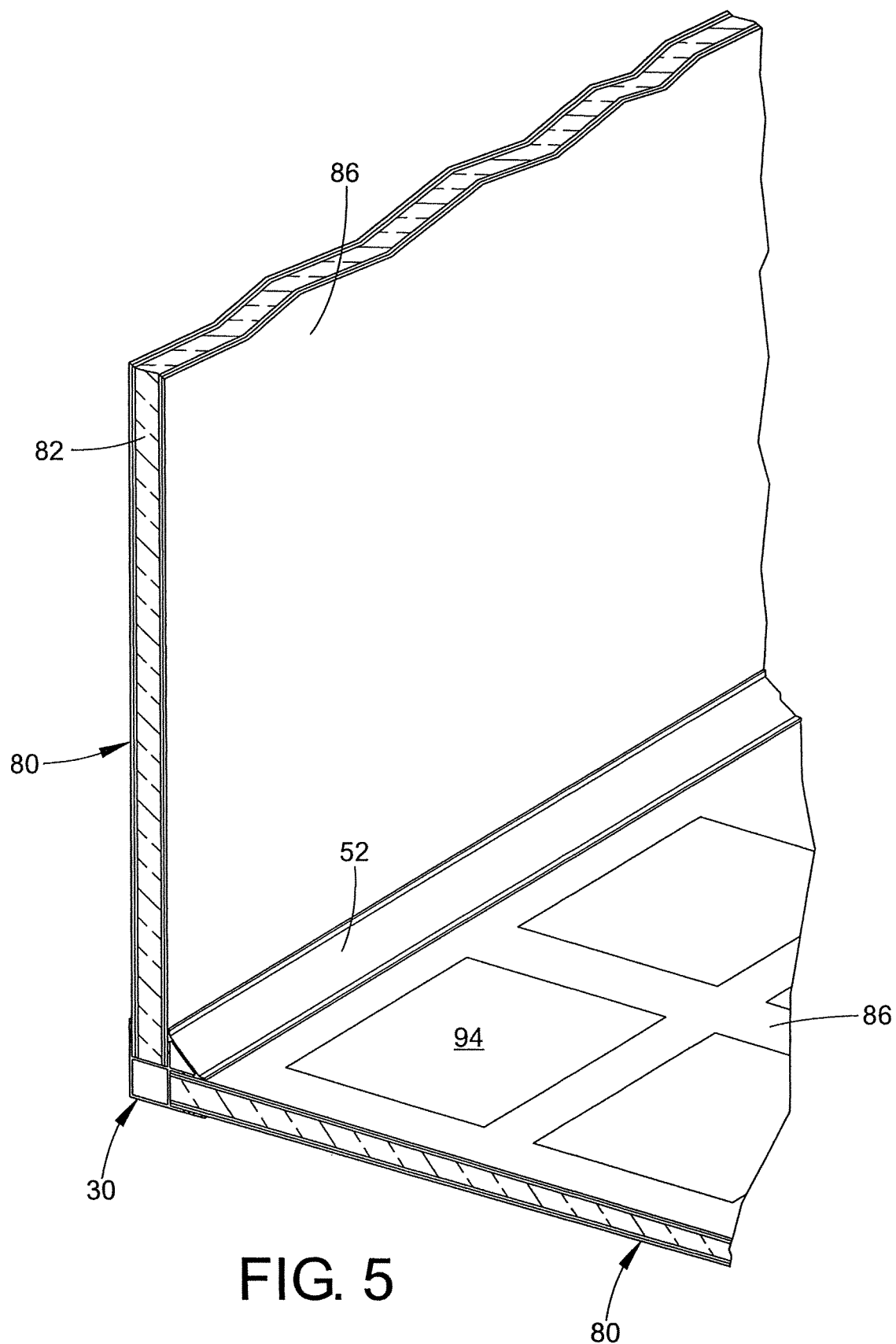
FIG. 5 is a perspective view of a portion of the containerized shelter according to the present disclosure in a partially assembled state.

In one embodiment, the various wall sections are held together by interconnected frame members 30. With reference now also to FIG. 4, in one embodiment, one such frame member can be made of a metal material such as an extruded aluminum alloy. The frame member can include a first outer side wall 32, and a second outer side wall 34, with the two outer side walls being oriented generally perpendicular to each other and which meet each other at a corner. The frame member 30 can further include first and second inner side walls 36 and 38 which are respectively spaced from the first and second outer side walls and intersect each other at right angles at a joint and which are also connected at one end, respectively, to the first and second outer side walls. As is evident from FIG. 4, a closed generally square chamber 44 is defined by the cooperation of the first and second outer side walls and the first and second inner side walls. Also defined by the cooperation of these walls is a first open U-shaped channel or pocket 46 and a second open U-shaped channel or pocket 48. Because the first outer side wall 32 and the first inner side wall 36 are oriented parallel to each other, they could be termed the first and second walls of the frame which cooperate to define a first channel 46. Similarly, the second outer sides wall 34 and second inner side wall 38 are oriented parallel to each other and could be termed third and fourth side walls of the frame member which cooperate to define a second channel 48. It should be appreciated that the first and second U-shaped channels 46 and 48 can be oriented transverse to each other. Thus, the frame member 30 defines generally right-angled corners for the shelter 10. An angled wall member 52 or brace extends between the first and second inner side walls 36 and 38 to provide additional rigidity to the frame member. The adjacent wall sections cooperate to define a second generally triangular closed chamber 54. The two chambers 44 and 54 meet each other at respective corners.

With further reference to FIG. 4, defined on opposing faces of the first outer side wall 32 and first inner side wall 36 are first inner grooves 56 which open to the first open channel 46. Defined on opposing faces of the second outer side wall 34 and second inner side wall 38 are second inner grooves 58 which open to the second open channel 48. In one embodiment, an adhesive 60 can be deposited in the several grooves 56 and 58 before the respective wall panels are slid into the first and second open channels 46 and 48. The first and second open channels are designed to be of a suitable width so that an edge of a wall panel may be inserted into the channel and held in place therein by the adhesive 60 deposited in the several grooves 56 and 58.

Further provided on the first and second inner walls 36 and 38, and located adjacent the angled wall 52, are respective first and second EMI gasket-holding grooves 64 and 68. Accommodated in the gasket grooves 64 and 68 can be a known metal mesh EMI gasket 70. EMI metal mesh gaskets are available in various cross sections to accommodate many different attenuation and mounting requirements encountered in EMI shielding applications. Thus, for example, the gaskets can be rectangular, round, round with a fin or double round in order to ensure that enclosures or other equipment will be RF sealed appropriately. For example, the gasket can be round. In one embodiment, the gaskets can be made of a knitted wire mesh with the material of the gaskets being made of, for example, a nickel-copper alloy, such as Monel, a ferrous alloy, such as a tin-steel combination or a beryllium copper alloy. Various materials for the mesh gasket are more or less effective in shielding. For example, attenuation levels up to 60 dB or perhaps even up to 120 dB at some frequencies are possible with wire mesh gaskets.

Through the use of EMI metal mesh gaskets 70 placed in the gasket grooves 64 and 68, a continuous shell of protection is provided against electromagnetic interference throughout the containerized shelter. Normally, this is very difficult to do around the edges and corners of known shelters. But, because of the cooperation of the angled wall 52 with the metal mesh gaskets 70 located in the gasket grooves 64 and 68, all edges and corners of the containerized shelter are protected from EMI interference. Therefore, EMI reflection, as well as absorption is now provided in a continuous uninterrupted shell from floor to wall to ceiling in the containerized shelter for a full 360° around the containerized shelter. In addition to providing EMI shielding for the shelter, the cooperation of the metallic frame members with the metal foil layer and the EMI gaskets will contain radio frequency interference (RFI) signals generated by equipment within the shelter. It is also conceivable that the disclosed EMI shelter will reduce the potentially damaging effects of high-altitude electromagnetic pulses (HEMP), as well as the harmful effects of electrical coupling which can be caused by near strike lightning.

In one embodiment, a shielding effectiveness of up to 60 decibels (db) can be provided in the frequency range of $1.3 \times 10^6$ all the way to $10^{10}$ frequency range in Hertz (Hz). The shielding effectiveness of frequencies from $10^3$ Hz to $1.3 \times 10^6$ Hz can vary linearly from 0 db at $10^3$ up to 60 db at $1.3 \times 10^6$ Hz. In other words, the shielding can be as required by ASTM designation E 1925-04. This provides a minimum attenuation of radiated and induced EMI fields within the frequency range of 100 kh to 10 ghz. The containerized EMI shelter also has grounding properties to protect personnel from electrostatic discharges and electrical system faults of internal equipment. If desired, lightning protection may also be provided for the EMI shelter disclosed herein.

Figure 3:
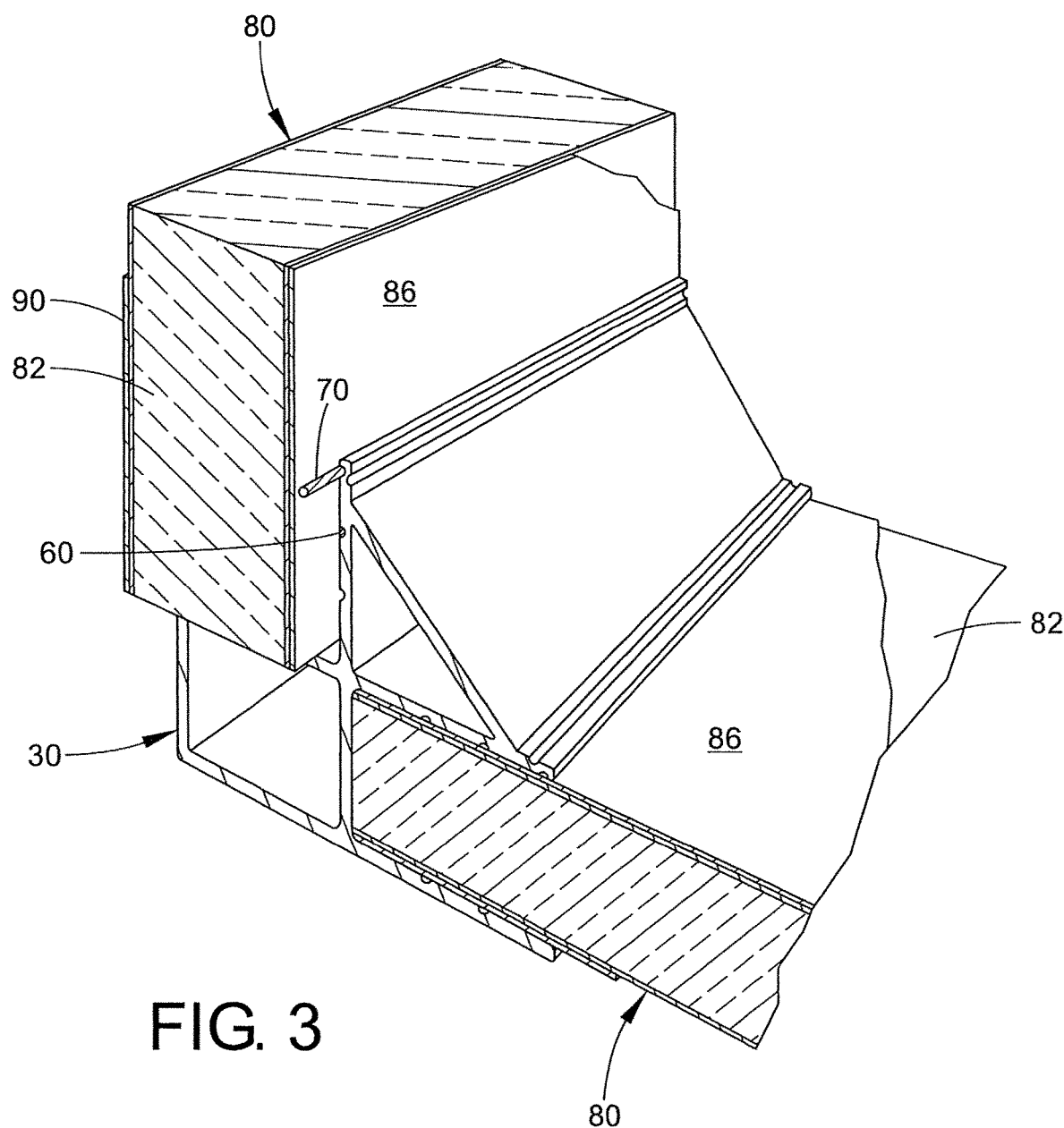
FIG. 3 is a greatly enlarged cross sectional view through a portion of the containerized shelter of FIG. 2.

With reference now to FIG. 3, the several wall members 18, 20, 24 and 26 and the two end members 14 and 16 can each be made of a layered or sandwich-type composite material wall panel 80. In one embodiment, the wall panel comprises a fiberglass composite core 82. Adhered to an inner surface of the core member 82 is an inner layer or film or foil 86 of a suitable metal material. In one embodiment, the metal layer 86 can be a relatively thin film made of a material such as aluminum on the order of 0.010 inches (0.025 cm) in thickness. The thickness of the metal film layer 86 can, in one embodiment, range between 0.005 inches and 0.020 inches (0.013 cm to 0.051 cm). The metal foil layer 86 may be adhered to the core 82 by a spray-on adhesive or a roll-on adhesive applied to at least one of the surfaces meant to be adhered. The metal material 86 can be aluminum, steel, or stainless steel. While the foil layer 86 is relatively thin, it can be patched as necessary if someone inadvertently pokes a hole in the foil layer. Because the foil layer 86 is relatively thin, it can better conform to the surface to which it is adhered, than could relatively thicker metal layers. If desired, the foil layer 86 could be coated on its interior face with a protective coating, such as a spray-on coating of a protective material, such as a resin. In order to protect a metal foil layer 86 adhered to the floor panel of the shelter, a rubber or vinyl flooring layer or carpeting can be employed over the foil layer 86.

The wall panel material, if it is comprised of a fiberglass composite material, is very durable. As a result, there may not be a need for an outside protective layer for the outer surfaces of the wall panels. In one embodiment, the panels 80 can be approximately 2.7 inches thick (6.86 cm). A panel of that thickness is believed to meet the 9 high stacking requirements of the ISO. All wall, ceiling and floor panels can be of the same thickness. The capacity of the floor wall panel can be about 57,000 lbs. (25,855 kg). Needless to say, with different sized ISO containers, the weight-bearing capacity of the floor panel may well be different. A fiberglass composite material is advantageous because it will stand up to various external weather conditions which could include snow, ice, or sand. Also, corrosion issues should not be a concern as there is no metal exposed on the exterior wall surfaces of the panels of the shelter. However, if desired, an outer protective layer 90 could be secured to an outer face of the core member 82. If employed, such an outer protective layer may have the same composition and the same thickness as the inner layer. Of course, the outer layer could also be made of a different material than the inner layer and could also be thicker if so desired for both structural rigidity and impact resistance.

In other embodiments, the core member 82 of the wall panel 80 may be made of other types of suitable materials. These can include fiber reinforced materials (carbon, aluminum or aramid fiber reinforced plastic materials), as well as thermally insulative materials. What is desirable for such wall panels is that they have a high strength-to-weight ratio, provide corrosion resistance, have a high stiffness-to-weight ratio, are chemically inert, have a high durability potential and good rigidity. The wall panels 80 can be manufactured to the desired size and can be mounted to the frame of the containerized shelter at the factory.

Composite wall panels are lower in cost and much lighter in weight than are similar metal wall panels. Moreover, composite panels are easier to assemble into a shelter, such as a containerized shelter because they require no complicated welding steps. As mentioned, composite fiberglass wall panels can be covered at least on their inner faces with a layer of metal in order to provide EMI protection. A composite material wall panel with a metal interior skin significantly reduces the amount of metal used in the walls of the containerized shelter, by perhaps as much as ninety five percent. Another benefit of providing a metal layer on the interior surface of the several wall sections of the containerized shelter is that the shelter walls will reflect light well and will aid in making for an attractive and functional shelter.

In one embodiment, the shelter walls can be mechanically held to the frame members by an adhesive material 60, such as epoxy, as shown in FIG. 4. The use of an adhesive such as epoxy is important for the structural strength of the shelter. In other words, no fasteners are employed except at the corners of the containerized shelter. Unlike spaced fasteners which concentrate stresses at their locations, an adhesive provides a continuous transfer of forces (and connection strength) to the wall panels. As well, an adhesive provides a water seal feature. Because the geometry of the illustrated extruded frame members, there would be no way to mount the wall panels of the shelter to the frame of the shelter but for depositing a bead of the adhesive 60 (such as epoxy) in the inner grooves 56 and 58 of the first and second open channels 46 and 48 before the respective wall panels 80 are inserted into the channels. Due to the geometry of the elongated frame members 30, getting all the sides of the containerized shelter to assemble correctly would have been quite difficult, were it not for the approach taken herein. With the wall members having the described construction, all four long edges of the shelter are made rigid. So, too, are the short edges defining the end walls of the shelter.

The containerized shelter 10, because it is of relatively lighter weight than a conventional ISO container or containerized shelter, is thus more easily transportable than are containerized shelters having solid metal walls. In one embodiment, for a 20-foot long 8-foot high (6.1 m by 2.4 m) container, the estimated weight is 3300 pounds (1497 kg) for a 1C and 1CX ISO container and 3600 pounds (1.633 kg) for a 1CC ISO container which is 20 foot long by 8.5 foot high (6.1 m by 2.59 m). A comparable ISO container made of a standard steel material for a 1C or 1CX container weighs about 4700 pounds (21312 kg). The containerized shelter disclosed herein has lower transportation and offloading costs and less site preparation is necessary in order to place the disclosed containerized shelter at its final location.

The containerized shelter 10 can be designed for the express purpose of housing electronic equipment and related components within a controlled environment as is necessary for the proper operation of such equipment. Moreover, the disclosed shelter is generally durable and is environmentally sound. One advantage of composite wall panels as compared to metal panels is that composite panels may eliminate or substantially reduce the amount of corrosion that the container undergoes when compared to the generally known steel containers. A flexible epoxy type adhesive which joins the fiberglass composite wall panels to the aluminum alloy frame will serve to manage the thermal expansion differences between these two materials.

As mentioned, the containerized shelter structure can be fitted at the factory with the necessary electrical and mechanical components to define a shelter which is usable promptly once it is deployed in the field. To this end, the bottom wall 26 of the containerized shelter can be provided with a plurality of floor panels or tiles 94, which can be made of a composite material, if so desired. Obviously, other types of floor covering, such as carpeting, could also be employed to protect the metal foil layer of the floor panel. It is desirable that the containerized shelter be impervious to weather and be weather tight. The containerized shelter can be provided with cable trays, equipment racks, main frames, ground bars, halo grounding systems and shelter alarm packages as may be considered desirable. It is believed that equipment racks or the like can be attached to the wall panels disclosed herein as they are structural wall members and can accommodate the weight of the components attached to them. Affixing equipment to the walls does not affect the EMI shielding which is provided by the metal layer 86 illustrated in FIG. 3, since EMI gaskets can be provided for the bolts mounting the equipment. Similarly, ferrite beads or ferrite chokes can be provided to encircle any power lines or other electrically conductive lines passing into the ISO container.

Figure 14:
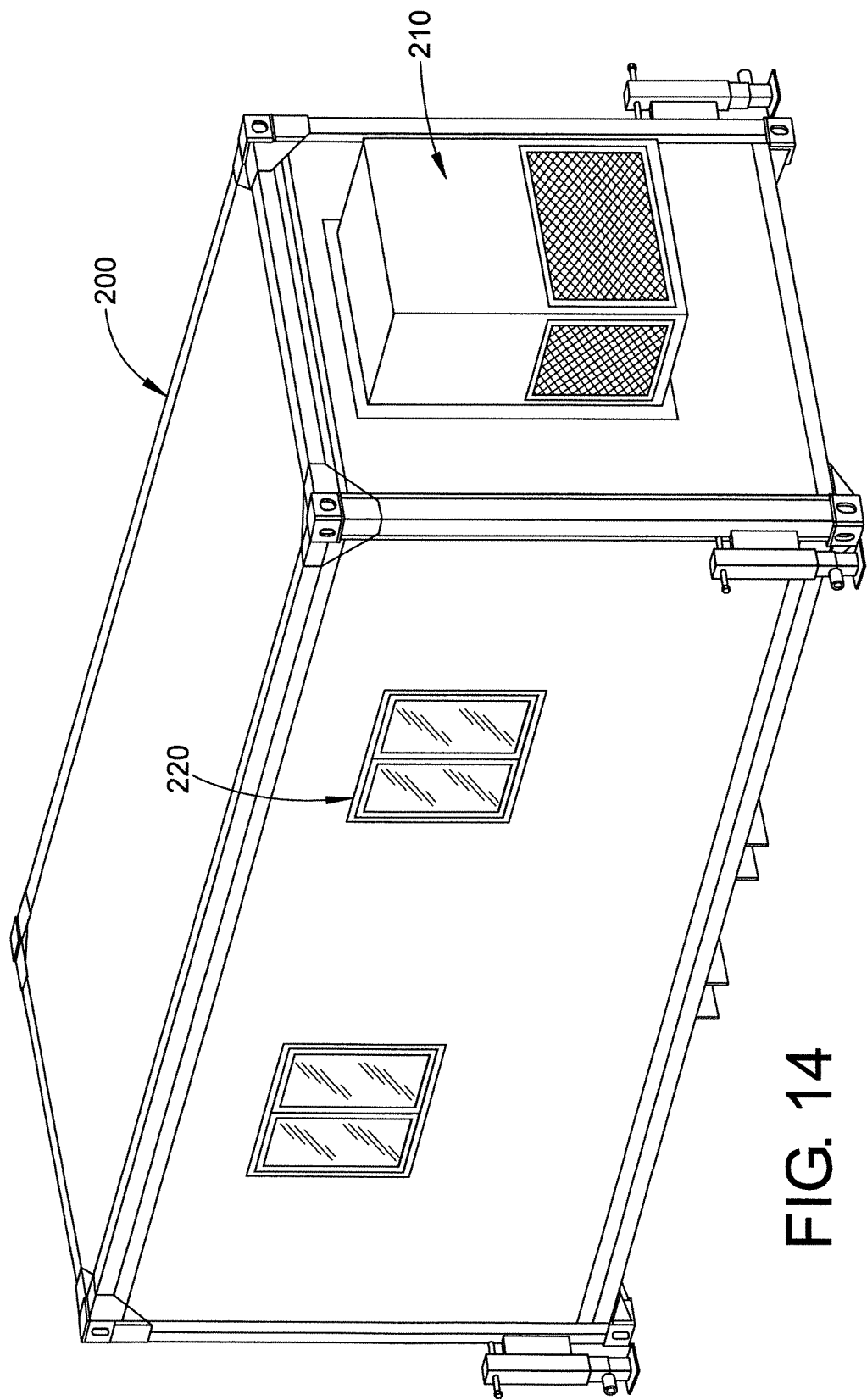
FIG. 14 is a perspective view of another embodiment of a shelter according to the present disclosure.

In addition, environmental control systems can be installed in the containerized shelter as deemed necessary. With reference now to FIG. 14, a shelter 200 can be ventilated, heated or cooled. One way of doing this is a direct mounted heating, ventilating and air conditioning (HVAC) system 210 which unit is mounted to an outside wall of the shelter 200 providing all of the HVAC functions directly into the shelter. Ducts which provide supply of and return of conditioned air would pass through a known metal honeycomb filter that serves to prevent EMI from entering or leaving the shelter. Another option would be to locate the HVAC system in a separate pallet from the container such that the supply and return air is ducted to the shelter. Still another option would be a split system where a condenser unit would be sitting outside the containerized shelter and a separate evaporator blower unit would be located inside the shelter to provide conditioned air. As mentioned, the shelter can be provided with one or more windows 220 (provided with EMI film-protected glass). After assembly, standard and customary wall, ceiling and floor treatments can be applied so that the inside of the shelter looks and operates as would a normal room. As mentioned, the containerized shelter can be preassembled at a manufacturing location. In this way, the containerized shelter ships as a whole and no field assembly is required.

Figure 6:
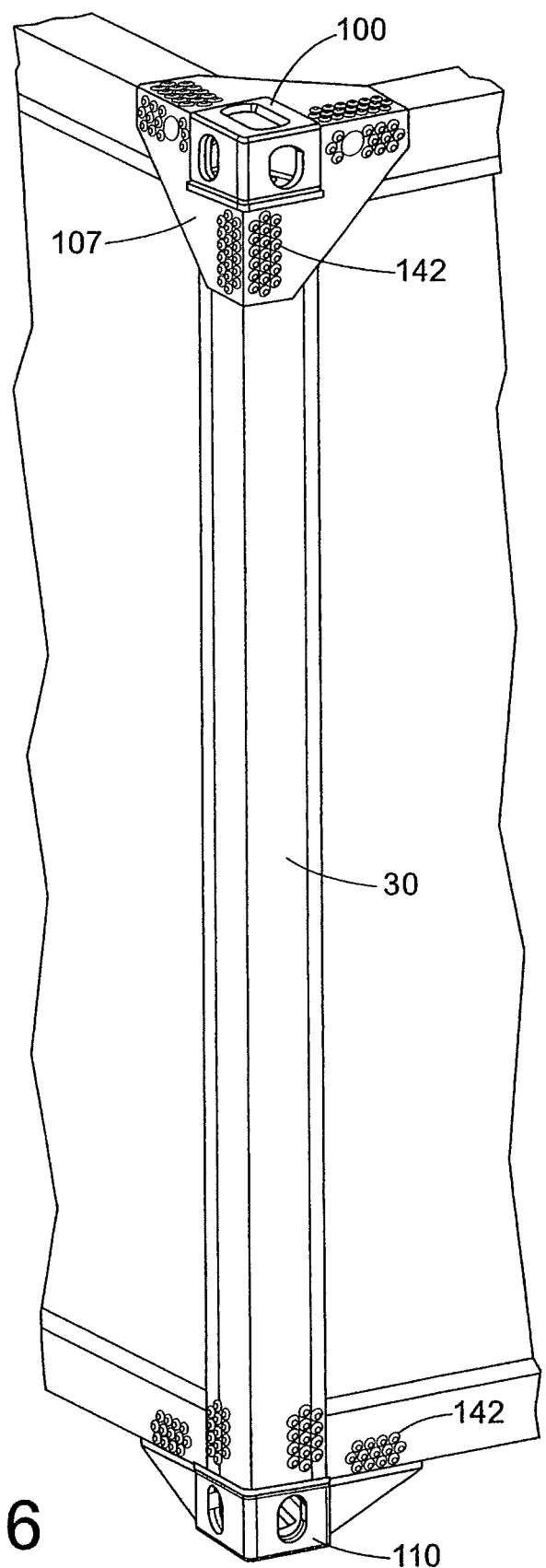
FIG. 6 is a perspective view of a corner portion of the containerized shelter of FIG. 1.
Figure 7:
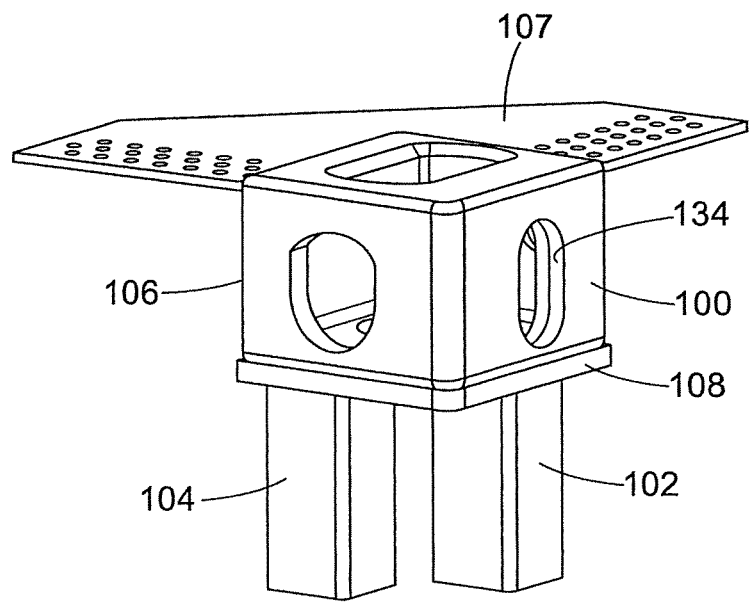
FIG. 7 is an enlarged perspective view of an upper corner element of the frame for the containerized shelter of FIG. 1, partially broken away for clarity.

With reference now to FIG. 6, an extruded corner frame member 30, which is a vertically oriented corner, can be fastened at its upper end to an upper corner element or member 100. As illustrated in FIG. 7, the upper corner element can comprise first and second stub shafts 102 and 104 which protrude downwardly from a base section 106. Wings 107 can be secured to the base section 106 to allow for better fastening of the upper corner element 100 to the corner frame members 30. In one embodiment, the stub shafts 102 and 104 can be made of steel, whereas the elongated frame member 30 can be made of an extrusion of an aluminum alloy material. If desired, a steel load bearing plate 108 can be secured to the base 106 of the corner element for proper structural weight bearing.

Figure 8:
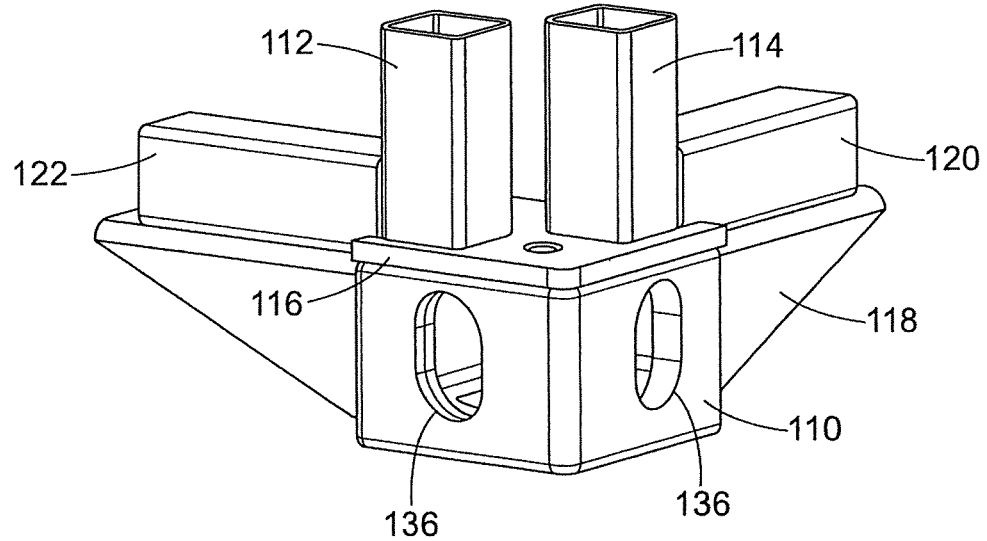
FIG. 8 is an enlarged perspective view of a lower corner element of the frame for the containerized shelter of FIG. 1.

With reference now also to FIG. 8, a lower corner element or member 110 includes first and second vertically extending stub shafts 112 and 114 mounted to a base 116. Extending at right angles from two adjacent faces of the base 116 are respective gusset plates 118. Each gusset plate can support a respective horizontally extending stub shaft 120 and 122. Such gusset plates are advantageous for absorbing "racking" forces when transporting the container.

Figure 9:
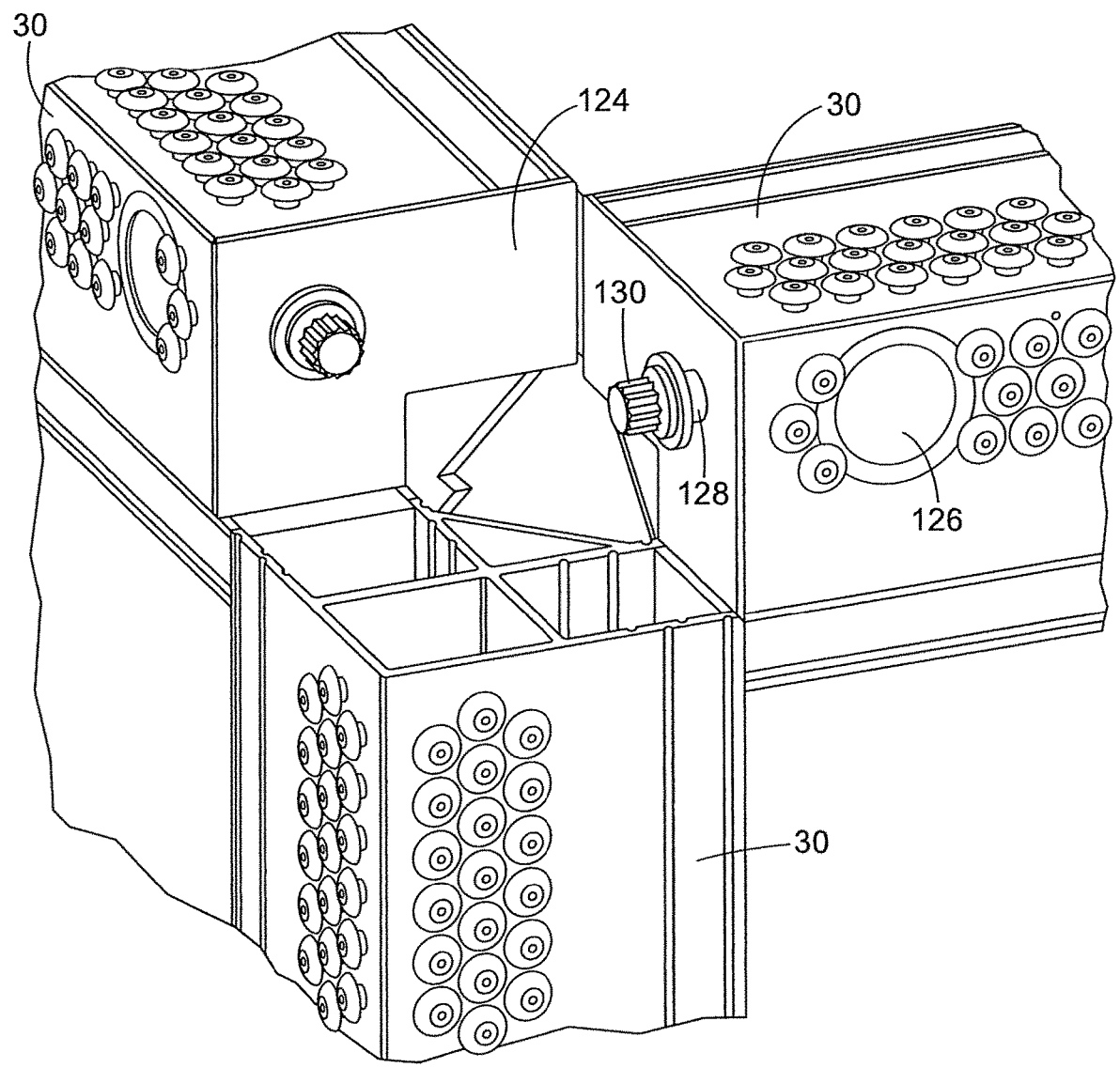
FIG. 9 is an enlarged perspective view of an upper corner portion of the frame assembly of the containerized shelter of FIG. 1, with the upper corner element removed for purposes of clarity.

With reference now to FIG. 9, illustrated is an upper corner section of one embodiment of the containerized shelter including three orthogonally oriented elongated frame members 30 which meet at a corner of the containerized housing. In one embodiment, a barrel fastener 126 including a fastener shaft 128 and a head 130 can cooperate with suitable wall sections of the upper corner element 100 via apertures or slots 134 located in the base 106 so as to fasten the upper corner element in place and rigidify the frame of the containerized shelter.

If desired, a rubber gasket, such as at 124, can be secured to the end faces of the extruded frame members 30 in order to retard rain, dust and the like from entering the ends of the frame members.

Figure 10:
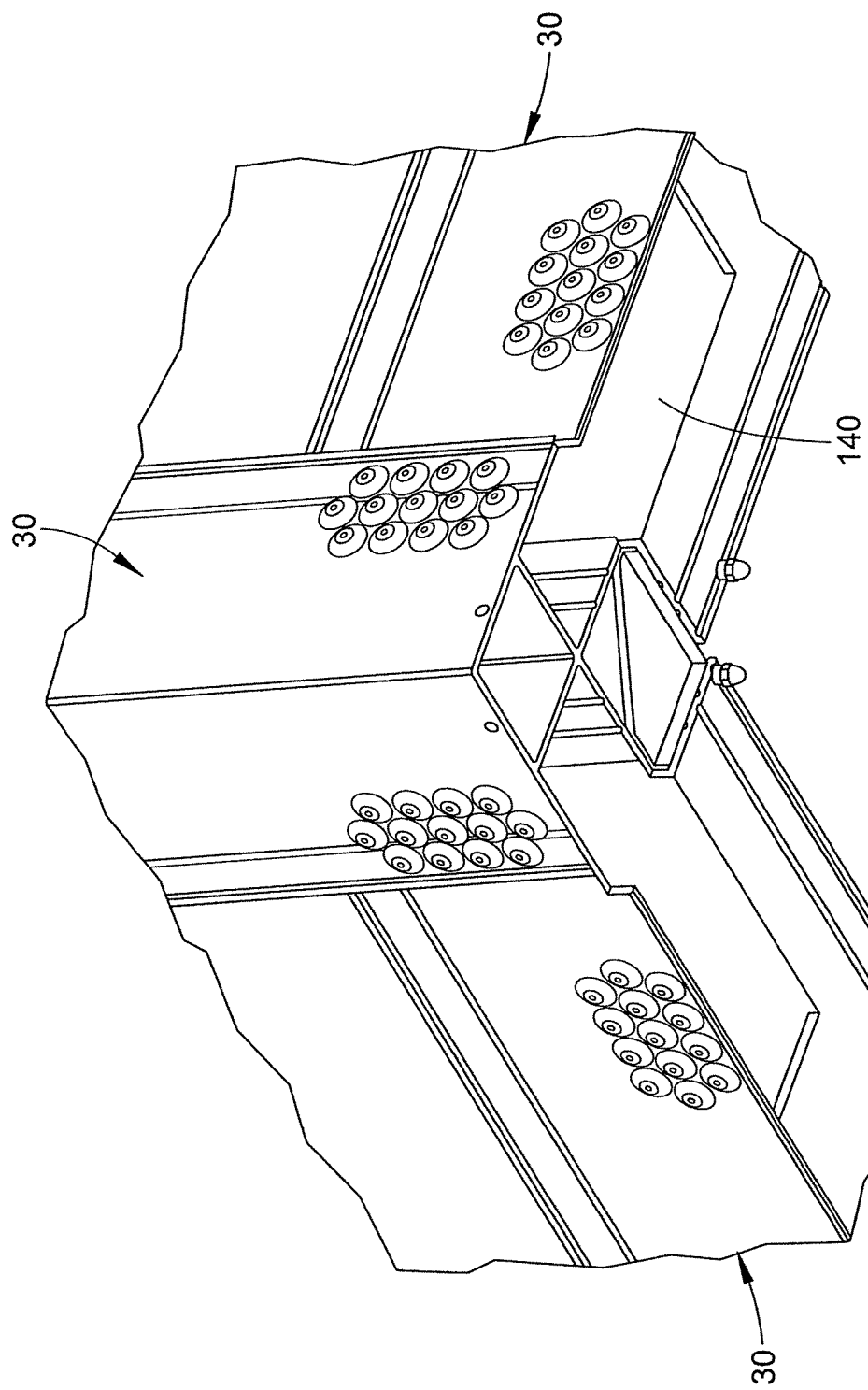
FIG. 10 is a perspective view of a lower corner portion of the containerized shelter of FIG. 1, with the lower corner element removed for purposes of clarity.

With reference again to FIG. 8, similar slots 136 can be provided in the base 116 of the lower corner element 110 in order to allow ISO container locking fasteners to secure the lower corner element in place on the framework of the containerized shelter 10. With reference now to FIG. 10, it can be seen that suitable slots 140 may be defined in the adjacent frame members 30 at the base of the containerized shelter 10 in order to accommodate the two horizontal stub shafts 120 and 122 of the lower corner assembly 110. Rivets 142 (see FIG. 6) can be employed to further secure the corner members 100 and 110 to the frame members 30.

It should be appreciated that due to the cooperation of the upper and lower corner elements 100 and 110 with the respective frame members 30, the containerized shelter 10 can be made into a rigid structure despite the fact that the wall panels of the containerized shelter are made from a generally non-metallic material. In this way, a rigid and lightweight containerized shelter can be provided.

Figure 11:
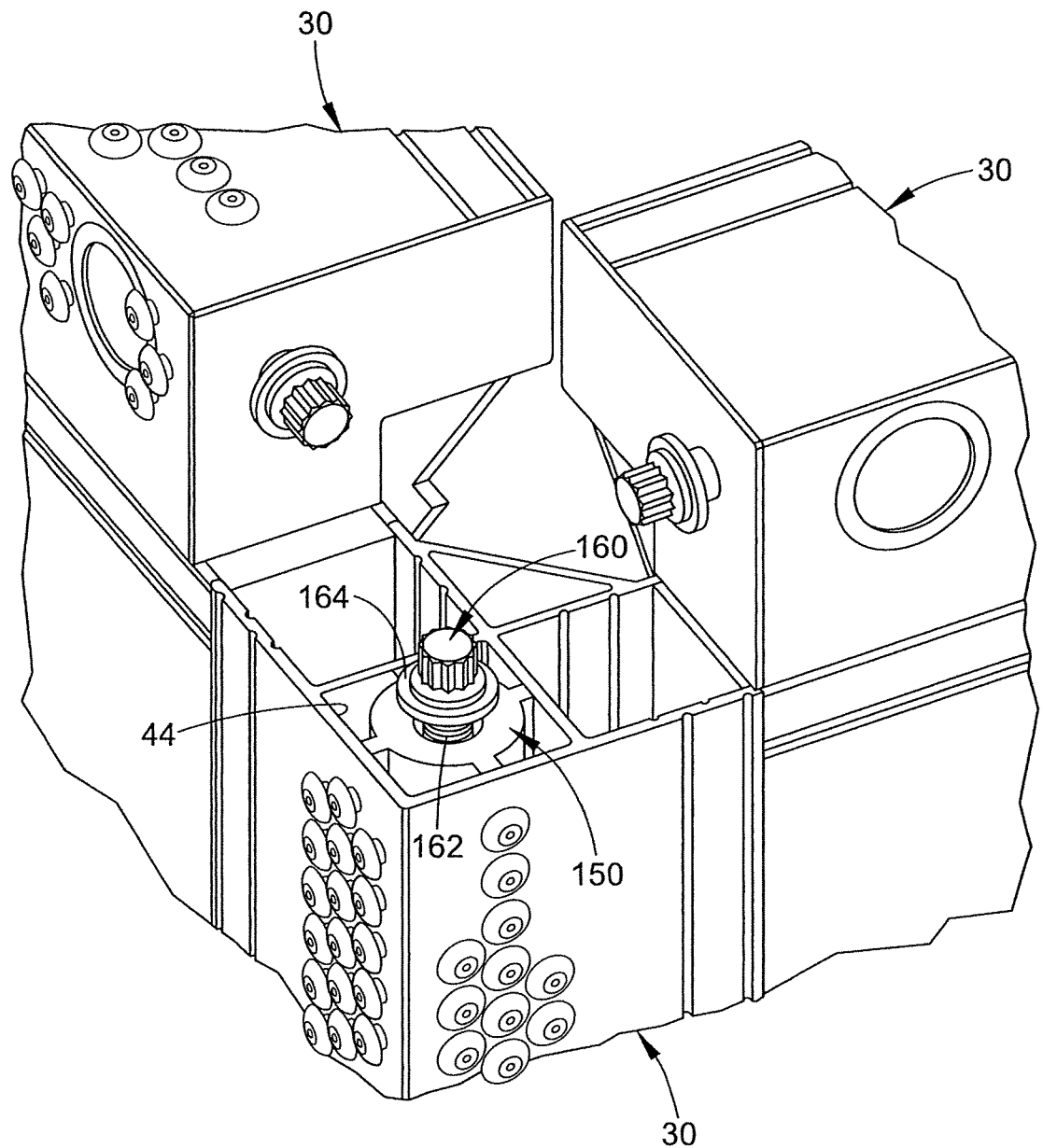
FIG. 11 is a perspective view of an upper corner portion of a containerized shelter according to a second embodiment of the present disclosure with a nine high stacking feature added.
Figure 12:
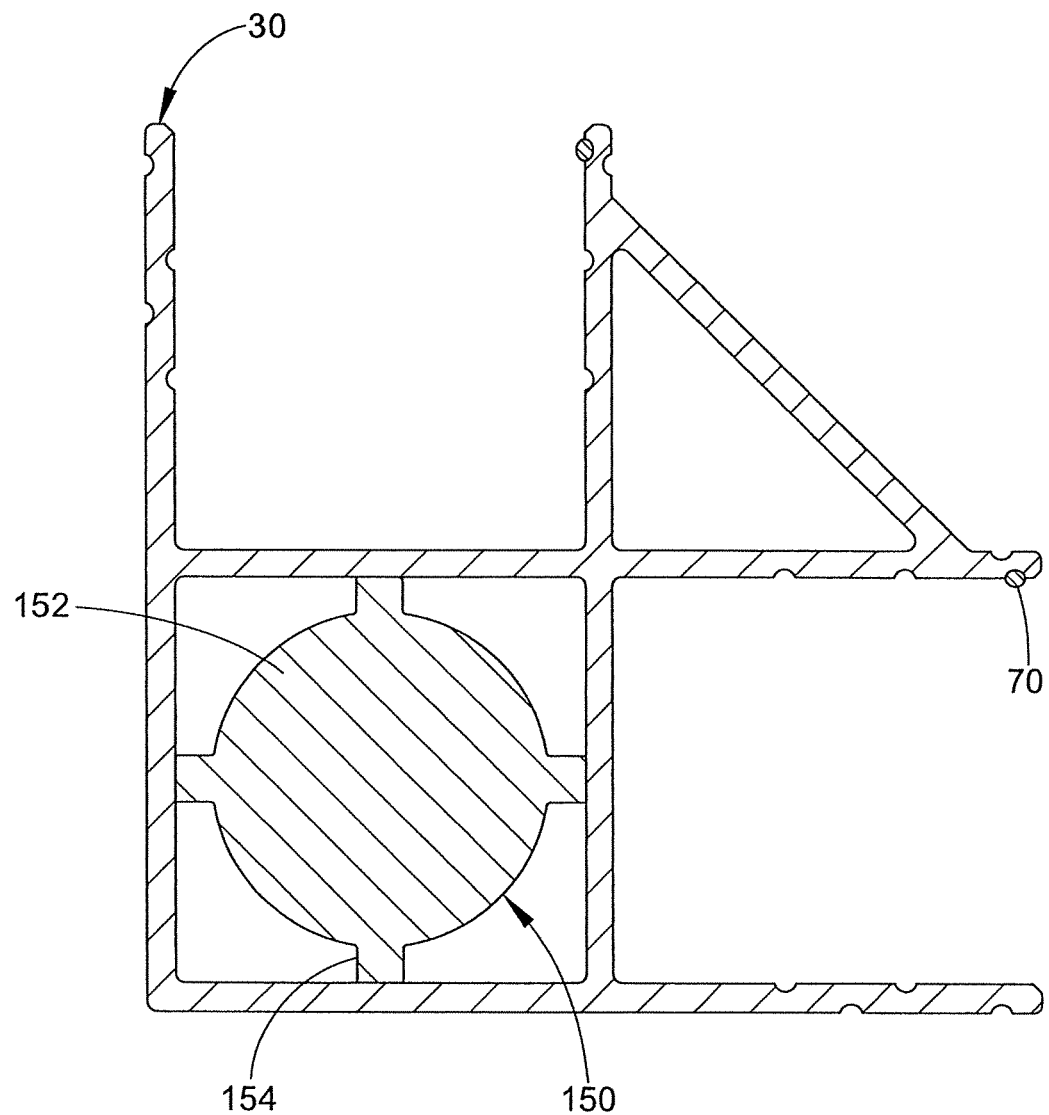
FIG. 12 is an enlarged top plan view in cross-section of a corner frame member or extrusion including the stacking feature of FIG. 11.

With reference now to FIG. 11, if desired, in order to obtain a nine high stacking feature required by the ISO for containers, the containerized shelter disclosed herein can be provided with a corner support element such as a metal rod. In one embodiment an aluminum rod is employed, which can be mounted in vertically oriented ones of frame members 30 such that the metal rods 150 are located in the closed chamber 44 defined by the elongated extrusion of the respective frame member. In one embodiment, the metal rods can include a generally cylindrical body 152. Located on the outer periphery of the body 152 can be a plurality of spaced wings 154. In one embodiment, four such orthogonally oriented wings can be provided. With reference now to FIG. 12, it can be seen that with such a design, the metal rod 150 is stably held in the closed chamber 44 defined in the frame member 30.

Figure 13:
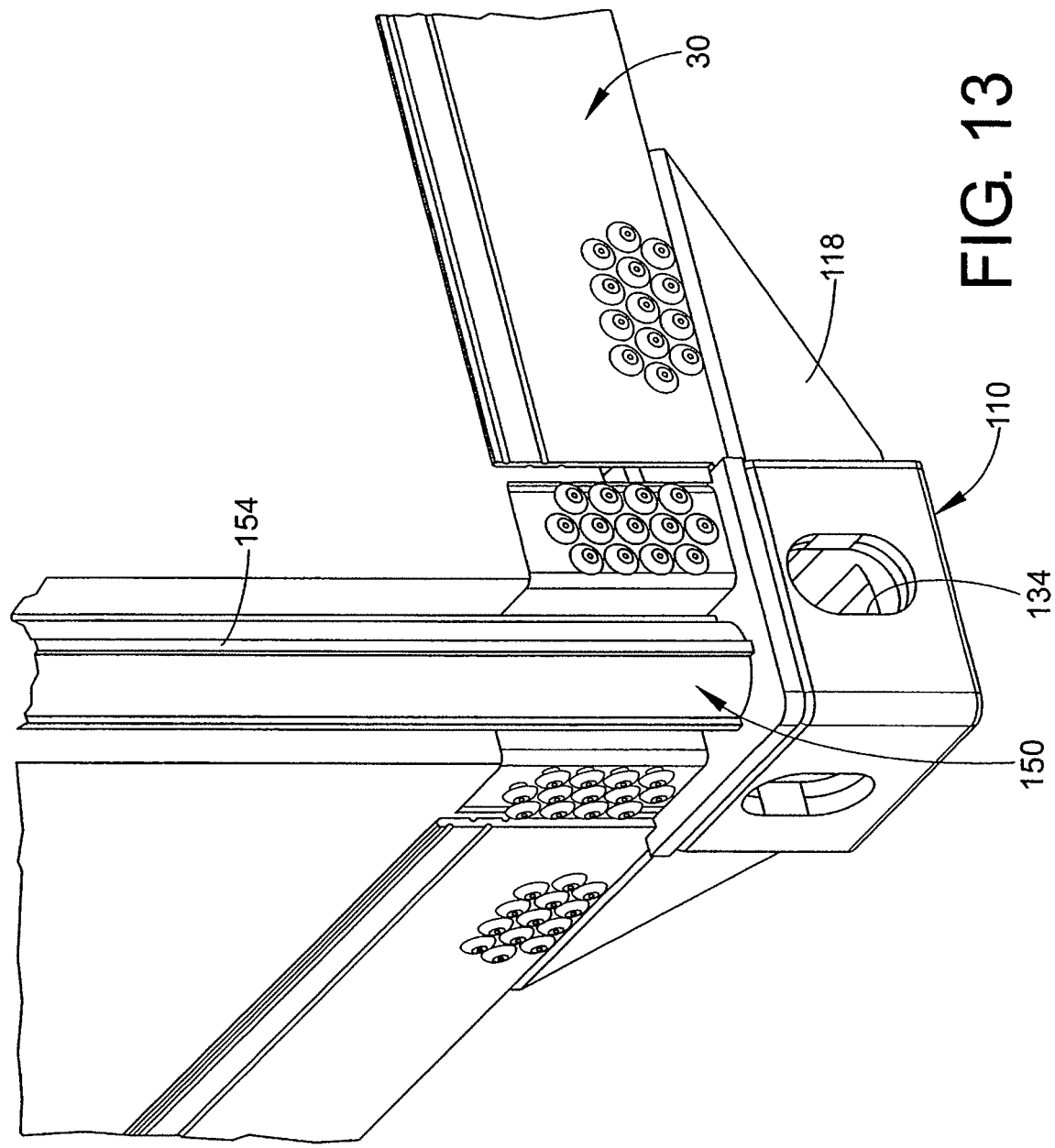
FIG. 13 is a perspective view in cross-section of a lower corner portion for an ISO containerized shelter with the stacking feature of FIG. 11 and with the corner frame member removed for purposes of clarity.

With reference now to FIG. 13, illustrated is such a nine high corner support 150 disposed in the frame member, with the frame member surrounding the corner support being removed for purposes of clarity. It should be appreciated that the metal rod fits snuggly within the vertical corner extrusion and fastens tight to the top and lower corner assemblies 100 and 110 via suitable fasteners 160, each including a shaft 162 and a head 164.

It should be appreciated that the simplicity of the design disclosed herein, namely, the use of identical wall panel material and identical frame members is greatly advantageous because only a few parts are needed in order to construct the disclosed containerized shelter. In one embodiment, the shelter can be 8 ft. wide, 8 to 9 ft. high and anywhere from 10 ft. to 40 ft. long, as may be required for a particular application.

With reference again to FIG. 1, levelling jacks 170 can be provided for the shelter for use at its final location. Moreover, the shelter can be provided with guides 174 for forklifts in order to enable local maneuvering of the containerized shelter during the process of its transportation or movement from its place of manufacture to its final location.

Disclosed have been several embodiments of a containerized shelter which can be used for commercial or military functions. The shelter can be manufactured with full electrical and lighting systems and ventilation systems, environmental control units and other interior enhancements, such as personnel doors and the like. Applications for such containerized shelters include insulated climate-controlled office and command centers, EMI radar shelters, data centers, medical shelters, workshops, and the like. The shelters could also be used for armories, weapons repair shops, interim housing, military barracks, equipment shelters for power generation systems, and the like.

The containerized shelters disclosed herein can be transported through the usual ISO shipping channels, whether by ship, rail, truck or helicopter. Moreover, they can be stacked or loaded using a forklift or a crane.

The present disclosure has been described with reference to several embodiments. Obviously, modifications and alterations will occur to others upon the reading and understanding of the preceding detailed description. For example, it should be evident that a variety of metallic and non-metallic materials may be employed for the construction of the containerized shelter without departing from the instant disclosure. So, for example, fibrous reinforcement can be employed in the wall panels disclosed herein for additional structural strength and integrity. It is intended that the present disclosure be construed as including all such modifications and alterations insofar as they come within the scope of the appended claims or the equivalents thereof.

The invention claimed is:

1. A shelter which provides electromagnetic interference (EMI) protection, said shelter comprising:
   first and second composite wall panels that are interconnected to each other by a frame member comprising first and second open channels arranged transversely relative to each other;
   said first and second wall panels each comprising a face, wherein a first metal foil layer is mounted on the face of said first panel and a second metal foil layer is mounted on the face of said second panel;
   wherein a first edge of said first wall panel including part of said first foil layer is located in said first open channel of said frame member and a second edge of said second wall panel including part of said second foil layer is located in said second open channel of said frame member such that said first and second wall panels are interconnected by said frame member.

2. The shelter as set forth in claim 1, wherein said frame member comprises:
   first and second outer side walls that are interconnected and arranged perpendicularly relative to each other;
   first and second inner side walls that are interconnected and arranged perpendicularly relative to each other;
   said first outer side wall and said first inner side wall arranged parallel with respect to each other and defining said first open channel;
   said second outer side wall and said second inner side wall arranged parallel with respect to each other and defining said second open channel.

3. The shelter as set forth in claim 2, wherein said first and second outer walls and said first and second inner walls comprise aluminum alloy.

4. The shelter as set forth in claim 3, wherein said first and second outer walls and said first and second inner walls comprise extruded aluminum alloy.

5. The shelter as set forth in claim 1, wherein said first metal foil layer and said second metal foil layer each comprise a thickness in the range of 0.005 inches to 0.020 inches.

6. The shelter as set forth in claim 5, wherein said first metal foil layer and said second metal foil layer each comprise an aluminum foil layer.

7. The shelter as set forth in claim 1, further comprising an electrically conductive mesh metal gasket engaged with said frame member.

8. The shelter as set forth in claim 2, wherein said first and second outer walls and said first and second inner walls cooperate to define a square chamber in said frame member.

9. The shelter as set forth in claim 8, wherein said frame member further comprises an angled wall member that extends between the first and second inner walls and that cooperates with the first and second inner walls to define a triangular chamber.

10. The shelter as set forth in claim 2, further comprising a corner element that is engaged with said frame member.

11. The shelter as set forth in claim 8, wherein the corner element comprises first and second vertically extending stub shafts which engage said frame member.

12. The shelter as set forth in claim 11, wherein said corner element comprises a base from which as first and second vertically extending stub shafts extend, said base comprising two adjacent faces from which respective gusset plates extends at a right angle with respect to each other, wherein each gusset plate supports a respective horizontally extending stub shaft.

13. The shelter as set forth in claim 12, wherein said corner element further comprises wings that extend outwardly from the base that are fastened to the frame member.

14. The shelter as set forth in claim 10, wherein said first and second outer walls and said first and second inner walls cooperate to define a chamber in said frame member, said shelter further comprising a metal rod located in said chamber.

15. The shelter as set forth in claim 14, wherein said corner element is fastened to said metal rod.

16. The shelter as set forth in claim 15, wherein said metal rod comprises a cylindrical body.

17. The shelter as set forth in claim 16, wherein said rod further comprises a plurality of wings located on a periphery of the cylindrical body.

18. The shelter as set forth in claim 17, wherein said plurality of wings comprises four orthogonally oriented wings.

19. The shelter as set forth in claim 7, wherein said electrically conductive mesh metal gasket engaged with said frame comprises: (i) a first electrically conductive mesh metal gasket located between said first foil layer and said frame in said first open channel; and (ii) a second electrically conductive mesh metal gasket located between said first foil layer and said frame in said first open channel.

20. The shelter as set forth in claim 19, wherein said frame comprises first and second gasket receiving grooves in which said first and second gaskets are located, wherein said first and second gasket receiving grooves are defined in said frame and open respectively into the first and second channels.

* * * * *